US010177471B2

(12) United States Patent
Emrys

(10) Patent No.: US 10,177,471 B2
(45) Date of Patent: Jan. 8, 2019

(54) COMPOSITE AND NANOWIRE CONDUIT

(71) Applicant: THE BOEING COMPANY, Chicago, IL (US)

(72) Inventor: Jonathan Emrys, Chicago, IL (US)

(73) Assignee: THE BOEING COMPANY, Chicago, IL (US)

(*) Notice: Subject to any disclaimer, the term of this patent is extended or adjusted under 35 U.S.C. 154(b) by 459 days.

(21) Appl. No.: 14/542,442

(22) Filed: Nov. 14, 2014

(65) Prior Publication Data
US 2016/0141773 A1 May 19, 2016

(51) Int. Cl.
H01R 11/01 (2006.01)
H01B 7/00 (2006.01)
H02G 3/04 (2006.01)
H01B 1/02 (2006.01)
H01B 3/30 (2006.01)
H01B 7/16 (2006.01)
(Continued)

(52) U.S. Cl.
CPC ............ H01R 11/01 (2013.01); B29C 70/865 (2013.01); H01B 1/026 (2013.01); H01B 3/307 (2013.01); H01B 7/0045 (2013.01); H01B 7/16 (2013.01); H01B 7/18 (2013.01); H01B 13/004 (2013.01); H01B 13/06 (2013.01); H01R 12/75 (2013.01); H01R 43/205 (2013.01); H01R 43/26 (2013.01); H02G 3/04 (2013.01); H02H 1/06 (2013.01); H05K 1/0296 (2013.01); H05K 1/034 (2013.01); H05K 1/09 (2013.01); H05K 3/101 (2013.01); H05K 5/0247 (2013.01); B64D 2221/00 (2013.01); Y02T 50/43 (2013.01)

(58) Field of Classification Search
USPC ....................................... 174/70 C
See application file for complete search history.

(56) References Cited

U.S. PATENT DOCUMENTS 3,612,744 A * 10/1971 Thomas ............... H01B 7/0838
174/117 FF
3,763,306 A * 10/1973 Marshall ............. H01B 7/0838
174/115
(Continued)

FOREIGN PATENT DOCUMENTS

EP 0 034 891 A2 9/1981
EP 2234120 A2 9/2010
(Continued)

OTHER PUBLICATIONS

Extended European Search Report, EU Patent Application No. 15191475.1-1809, dated Apr. 8, 2016.

Primary Examiner — William H Mayo, III
Assistant Examiner — Krystal Robinson
(74) Attorney, Agent, or Firm — Haynes and Boone, LLP

(57) ABSTRACT

An electrical wiring system comprises a plurality of electrical conduits, each of which comprises a plurality of electrically conductive wires, a carrier encapsulating and electrically insulating the wires from each other, the carrier being composed of a rigid material, and at least connector carried by the carrier in electrical communication with the wires. The electrical wiring system further comprises a junction box comprising a plurality of interconnecting wires and a plurality of connectors electrically coupled together by the interconnecting wires. The plurality of connectors of the junction box are coupled to the plurality connectors of the electrical conduits.

20 Claims, 8 Drawing Sheets

(51) Int. Cl.
*H01B 7/18* (2006.01)
*H01B 13/004* (2006.01)
*H01B 13/06* (2006.01)
*H01R 12/75* (2011.01)
*H01R 43/20* (2006.01)
*H01R 43/26* (2006.01)
*H02H 1/06* (2006.01)
*H05K 1/02* (2006.01)
*H05K 1/03* (2006.01)
*H05K 1/09* (2006.01)
*H05K 3/10* (2006.01)
*H05K 5/02* (2006.01)
*B29C 70/86* (2006.01)

(56) References Cited

U.S. PATENT DOCUMENTS

| | | | | |
|---|---|---|---|---|
| 3,874,762 | A * | 4/1975 | Shott | H01R 13/518 439/357 |
| 3,887,265 | A * | 6/1975 | Margolis | G02B 6/4403 174/117 F |
| 3,914,531 | A * | 10/1975 | Zell | H01B 7/08 174/117 F |
| 3,978,291 | A * | 8/1976 | Bergeron, Jr. | H04Q 1/145 379/16 |
| 4,037,922 | A * | 7/1977 | Claypoole | G02B 6/4432 385/104 |
| 4,481,379 | A * | 11/1984 | Bolick, Jr. | H01B 7/0838 174/117 F |
| 4,518,632 | A * | 5/1985 | Jones | D01F 11/127 174/128.2 |
| 4,652,772 | A * | 3/1987 | Shephard | H01B 7/0838 174/117 F |
| 4,923,537 | A | 5/1990 | Matsushima | |
| 6,067,394 | A * | 5/2000 | Ruello | G02B 6/4402 385/100 |
| 6,317,540 | B1 * | 11/2001 | Foulger | G02B 6/4469 324/555 |
| 6,577,797 | B2 * | 6/2003 | Quiroz | H01B 9/005 385/114 |
| 6,687,437 | B1 * | 2/2004 | Starnes | G02B 6/4416 174/113 R |
| 8,847,074 | B2 * | 9/2014 | Mann | H01B 1/04 174/102 SC |
| 8,847,174 | B2 * | 9/2014 | Domenig | A61L 2/10 250/453.11 |
| 2003/0135971 | A1 * | 7/2003 | Liberman | B01D 67/0041 29/419.1 |
| 2004/0091221 | A1 * | 5/2004 | Debban, Jr. | G02B 6/4411 385/114 |
| 2005/0006126 | A1 * | 1/2005 | Aisenbrey | B29C 45/0013 174/68.1 |
| 2005/0106348 | A1 | 5/2005 | Koike et al. | |
| 2011/0100674 | A1 * | 5/2011 | Pagliuca | C08L 71/00 174/110 SR |
| 2011/0174519 | A1 * | 7/2011 | Shah | H01B 3/004 174/119 C |
| 2013/0008684 | A1 * | 1/2013 | Weitzel | H01B 13/0026 174/107 |
| 2015/0184469 | A1 * | 7/2015 | Sherman | E21B 17/206 385/101 |
| 2017/0040306 | A1 * | 2/2017 | Kim | H01L 25/167 |

FOREIGN PATENT DOCUMENTS

| | | | |
|---|---|---|---|
| EP | 2437363 | A1 | 4/2012 |
| EP | 2487692 | A1 | 8/2012 |
| EP | 2487693 | A1 | 8/2012 |
| EP | 2690208 | A1 * | 1/2014 ............ D04H 3/009 |
| JP | S61 23127 | U | 2/1986 |
| JP | 2003197038 | A | 7/2003 |
| JP | 2006310213 | A * | 11/2006 |
| JP | 2012151929 | A | 8/2012 |

* cited by examiner

COMPOSITE AND NANOWIRE CONDUIT

FIELD

The present disclosure relates to electrical wiring systems for structures, such as aircraft and spacecraft.

BACKGROUND

As a result of newly developed composite materials for use in the manufacturing of aircraft, such as the Boeing 787 aircraft, the need to deliver lighter-weight, more fuel-efficient, aircraft is paramount to aircraft manufacturers for generating cost-savings for both the customers and the aircraft manufacturers themselves. The weight management approach to cost-savings is also useful in all other areas of manufacturing, from new aircraft to retrofitting old aircraft, and with the use in next generation spacecraft as well.

As part of the need to reduce weight on aircraft and spacecraft, engineers typically look to the single most blatant offender: copper wiring. Copper is the most widely used conductive material for electrical wiring, but it is also an extremely expensive material, as well as being extremely heavy when bundled together with other wires and cabling. Thus, the most egregious contribution to weight on aircraft is attributed to copper wiring.

One solution to reduce the weight of the copper wire involves using polytetrafluoroethylene (Teflon®) coated copper wire, which is significantly lighter than the traditional wire insulation, but which has been reported to be more delicate and fragile. If this is the case, and Teflon® insulation is that fragile, then such light-weight wiring comes at a cost, which is the need for special handling of the long lengths of thick bundles of wiring to prevent damage.

As such, there is a need for an improved wiring for aircraft, spacecraft, and other structures.

SUMMARY

In accordance with a first aspect of the present inventions, an electrical conduit comprises a plurality of electrically conductive wires (e.g., nanowires), and a carrier encapsulating and electrically insulating the wires from each other, the carrier being composed of a rigid material (e.g., a composite material). The rigid material may have a modulus of elasticity greater than 1 gigapascal (GPa), and in some embodiments, may be greater than 2 GPa. In one embodiment, the carrier is planar, and the wires are arranged relative to each other in a single rectilinear plane. In another embodiment, carrier is cylindrical, and the wires are arranged relative to each other in three-dimensional space. In still another embodiment, the electrical conduit is entirely solid.

In one embodiment, the electrical conduit further comprises at least one connector mounted to an end of the carrier and being electrically coupled to the wires. The connector(s) may comprise a plurality of electrically conductive receptacles in electrical communication with the plurality of wires. The electrical conduit may further comprise a pair of slots extending along opposing sides of the carrier at the end of the carrier and/or a slot formed along the length of the carrier.

One method of manufacturing the electrical conduit comprises disposing an electrically insulative material in an elongated mold having a length, suspending the wires in the electrically insulative material along the length of the mold, curing the electrically insulative material in the mold to form the carrier and integrate the wires in the mold, and removing the integrated carrier and wires from the elongated mold.

Another method of manufacturing the electrical conduit comprises forming lumens through a length of the carrier, and growing the wires inside of the lumens.

Still another method of manufacturing the electrical conduit comprises disposing a first portion of a liquefied electrically insulative material in an elongated mold having a length, at least partially curing the first portion of the liquefied electrically insulative material in the elongated mold, disposing the wires on top of the at least partially cured portion of the electrically insulative material along the length of the mold, disposing a second portion of the liquefied electrically insulative material over the at least partially cured portion of the electrically insulative material in the elongated mold, completely curing the electrically insulative material in the mold to form the carrier and integrate the wires between the first and second portions of the completely cured electrically insulative material, and removing the integrated carrier and wires from the elongated mold.

Yet another method of manufacturing the electrical conduit comprises extruding an liquid insulative material, wherein the wires are embedded in the liquid insulative material during the extrusion, and curing the liquid insulative material to form the carrier.

In embodiment, an electrical wiring system comprises the electrical conduit, and a junction box comprising a plurality of interconnecting wires and a plurality of connectors electrically coupled together by the interconnecting wires. One of the connectors of the junction box is coupled to at least one connector of the electrical conduit.

In accordance with a second aspect of the present inventions, a junction box for coupling a plurality of conduits together is provided. Each of the electrical conduits carries a plurality of wires and a female connector having a plurality of receptacles in electrical communication with the plurality of wires. The pins may, e.g., be arranged relative to each other in a single rectangular plane or arranged relative to each other in three-dimensional space.

The junction box further comprises a plurality of interconnecting wires (e.g., nanowires), and a plurality of male connectors. The interconnecting wires electrically couple the male connectors together, and each of the male connectors including a plurality of pins, a housing containing the plurality of pins, and an actuator mounted to the housing and configured for linearly translating the plurality of pins into the plurality of receptacles of a respective one of the female connectors.

In one embodiment, the actuator is configured for being linearly translated relative to the housing to linearly translate the plurality of pins into the plurality of receptacles. In another embodiment, the actuator is configured for sliding over the housing to linearly translate the plurality of pins into the plurality of receptacles. In this case, the housing may comprise a plurality of slots, and the junction box may further comprise a plurality of levers extending from the actuator into the slots and mechanically coupled to the plurality of pins. In still another embodiment, the actuator is configured for being rotationally translated relative to the housing to linearly translate the plurality of pins into the plurality of receptacles. In yet another embodiment, the junction further comprises a plurality of electrically conductive coils contained within the housing, in which case, the plurality of conductive coils may be electrically coupled between the plurality of pins and the interconnecting wires. In yet another embodiment, each of the electrical conduits includes a slot formed adjacent the female connector, and the junction box further comprises a rail associated within the actuator of each of the male connectors. In this case, the actuator may be configured for slidably engaging the rail within the slot of the respective conduit.

In one embodiment, the junction box further comprises a central wiring module (which may be interchangeable and may be rectangular) containing the interconnecting wires, the plurality of male connectors are mechanically coupled to a periphery of the central wiring module, and the actuator is configured for linearly translating the plurality of pins away from the periphery of the central wiring module. In another embodiment, the junction box further comprises a plurality of seats on top of which ends of the conduits may be disposed. The seats extend from the periphery of the central wire module underneath the respective plurality of male connectors.

In accordance with a third aspect of the present inventions, an electrical wiring system comprises a plurality of electrical conduits, each of which comprises a plurality of electrically conductive wires (e.g., nanowires), a carrier composed of a rigid material (e.g., a composite material) and encapsulating and electrically insulating the wires from each other, and at least connector carried by the carrier in electrical communication with the wires. The rigid material may have a modulus of elasticity greater than 1 gigapascal (GPa), and in some embodiments, may be greater than 2 GPa. In one embodiment, the carrier is planar, and the wires are arranged relative to each other in a single rectilinear plane. In another embodiment, carrier is cylindrical, and the wires are arranged relative to each other in three-dimensional space. In still another embodiment, the electrical conduits are entirely solid.

The electrical wiring system further comprises a junction box comprising a plurality of interconnecting wires and a plurality of connectors electrically coupled together by the interconnecting wires. The plurality of connectors of the junction box are coupled to the plurality of connectors of the electrical conduits.

In one embodiment, the connector(s) of the electrical conduits are female connectors, and the connectors of the junction box are male connectors. In another embodiment, the electrical wiring system further comprises a plurality of mounting brackets, each of which is configured being mounted to a stable structure. In this case, the electrical conduits are engaged with the brackets in a snap-fit arrangement. In still another embodiment, the junction box includes another connector electrically coupled to the plurality of connectors of the junction box by the interconnecting wires. In this case, the electrical wiring system further comprises a cable comprising a plurality of individually insulated wires and a connector that is in electrical communication with the insulated wires and that is incompatible with the other connector of the junction box. The electrical wiring system further comprises an adapter coupling the connector to the other connector of the junction box. In yet another embodiment, an aircraft or spacecraft comprises a compartment and the electrical wiring system mounted within the compartment.

In accordance with a fourth aspect of the present invention, a method of installing an electrical wiring system on a structure of an aircraft or spacecraft comprises mounting two junction boxes spaced apart on the structure. Each of the junction boxes has a connector.

The method further comprises disposing a rigid electrical conduit between the connectors of the two junction boxes. The rigid material may have a modulus of elasticity greater than 1 gigapascal (GPa), and in some embodiments, may be greater than 2 GPa. The electrical conduit comprises a plurality of wires, and connectors at opposing ends of the electrical conduit in electrical communication with the plurality of wires. The electrical conduit has a length, such that the connectors are flush with the respective connectors of the junction boxes when they are disposed therebetween. In one embodiment, the electrical conduit is planar, and the wires are arranged relative to each other in a single rectilinear plane. In another embodiment, the electrical conduit is cylindrical, and the wires are arranged relative to each other in three-dimensional space. In still another embodiment, the electrical conduit is entirely solid. The method further comprises coupling the respective connectors of the junction boxes to the connectors of the conduit. In one embodiment, the connectors of the electrical conduit are female connectors, and the connectors of the junction boxes are male connectors.

An optional method comprises mounting a bracket onto the structure between the junction boxes, wherein disposing the conduit between the junction boxes comprises snap fitting the conduit into the bracket. In another optional method, one of the junction boxes includes another connector electrically coupled to the first connector of the junction box by interconnecting wires. This method further comprises mounting an adapter to the other connector of the junction box, and coupling a connector of a cable to the adapter. The cable comprising a plurality of individually insulated wires in electrical communication with the connector of the cable, and the connector is incompatible with the other connector of the junction box.

DRAWINGS

These and other features, aspects, and advantages of the present disclosure will become better understood with regard to the following description, appended claims, and accompanying drawings where:

DESCRIPTION

Figure 1:
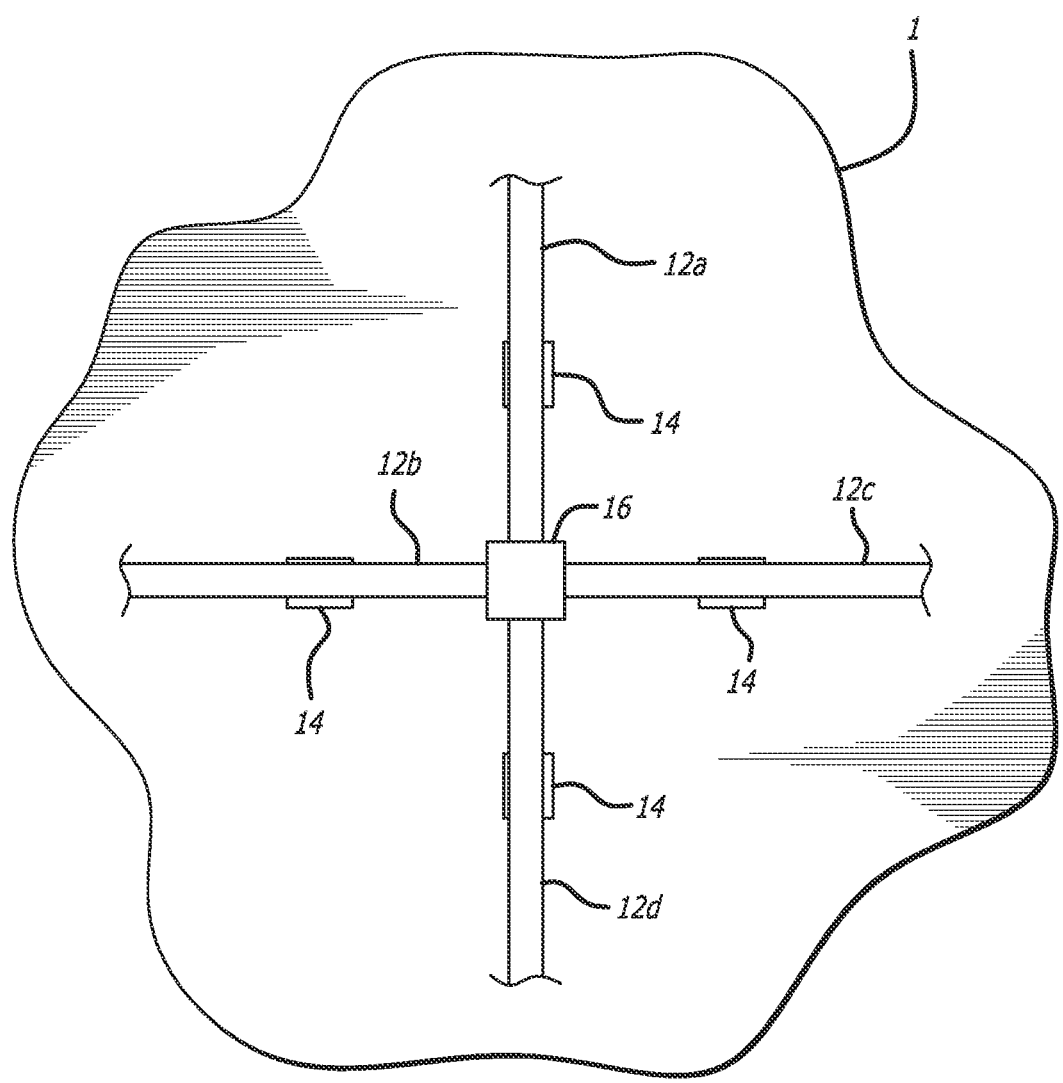
FIG. 1 is a plan view of one embodiment of an electrical wiring system constructed in accordance with the present inventions.
Figure 2:
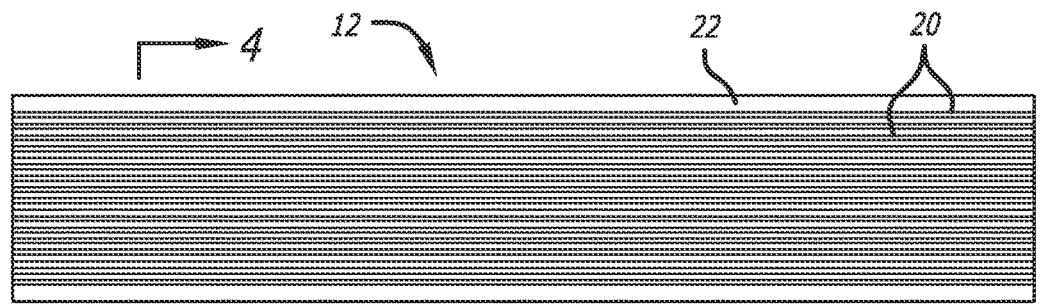
FIG. 2 is a plan view of one embodiment of a flat nanowire electrical conduit that can be used in the electrical wiring system of FIG. 1.
Figure 3:
FIG. 3 is a profile view of the nanowire electrical conduit of FIG. 2.

Referring to FIG. 1, an electrical wiring system 10 that can be mounted to the structure of an aircraft or spacecraft 1 will now be described. For example, in the case of an aircraft, the electrical wiring system 10 can be mounted to or within the walls and bulkheads of the fuselage, within the walls and bulkheads of the luggage hold, or within the structure of the wings and stabilizer.

The electrical wiring system 10 generally comprises a plurality of electrical nanowire conduits 12 (four shown), a plurality of brackets 14 configured for mounting the conduits 12 to the appropriate structure of the aircraft or spacecraft 1, and a plurality of junction boxes 16 (only one shown for purposes of brevity) that mechanically and electrically couples the conduits 12 together. One of the conduits 12a can, e.g., terminate in a control mechanism (not shown) contained in the cockpit of the aircraft, another of the conduits 12b can, e.g., terminate in the left wing of the aircraft, still another of the conduits 12c can, e.g., terminate in the right wind of the aircraft, and yet another of the conduits 12d can, e.g., terminate in the tail section of the aircraft.

All the components of the electrical wiring system 10, including the conduits 12, mounting brackets 14, and junction boxes 16, are composed of a light-weight material. The conduits 12 may be mounted flat to the surface, and the mounting brackets 14 would be attached at specific points at each distances, such as at the top of the fuselage interior, or between bulkheads, or anywhere else that the conduits 12 must be installed. Specific lengths of the conduits 12 would then be run along those points, being quickly and easily attached to the mounting brackets 14 by simply snapping them in place, until they reach the desired junction box 16. These junction boxes 16 are specifically designed for use with the conduits 12, with the specific placement determined by the routes the conduits 12 would need to travel, and the lengths of the conduits 12 dictated by the distance to the next junction box 16.

Although four nanowire conduits 12 are shown in the electrical wiring system 10, it should be appreciated that electrical wiring system 10 may alternatively have less or greater than four nanowire conduits 12. The conduits 12 are of appropriate lengths necessary to reach the installed junction boxes 16. The conduits 12 may have an appropriate width, e.g., less than one foot, and preferably less than 2 inches. For example, an exemplary conduit 12 may have a width of one and half inches. The conduits 12 take the form of strips that are planar in nature to facilitate low-profile conformance to the structure on which the conduits 12 will be mounted, and may have a thickness less than one-quarter inch, and preferably less than one-eighth inch. For example, the exemplary conduit 12 may have a thickness of one-sixteenth inch.

As will be described in further detail below, the conduits 12 described herein are much lighter than the current Teflon®-coated copper wire, and should be more resistant to damage. In addition, the conduits 12 should be able to perform more functions, as it has the capability to carry more wire in a very little space—in a single, thin, compact conduit in long strips, in lieu of the long lengths of thick bundles of wiring that risk being easily damaged regardless of any Teflon® fragility issues. In addition to reducing the weight of the aircraft or spacecraft and requiring less space, the conduits 12 can be more easily installed, repaired, and replaced.

Referring to FIGS. 2-5, one of the electrical conduits 12 will now be described. Significantly, each nanowire conduit 12 comprises a plurality of nanowires 20. In the exemplary case, each nanowire conduit 12 comprises thirty nanowires 20, although less or more nanowires 20 can be provided. A nanowire is generally defined as a nanoscale rod, in the scale of 100 s or 1000 s of nanometers; about the thickness of a human hair, which is approximately 80,000-100,000 nanometers in diameter. For the purposes of this specification, a nanowire is an electrically conductive wire having a diameter less than 100,000 nanometers, and may be even be smaller, e.g., in the range of 1,000-10,000 nanometers. Nanowire is generally stronger, lighter, and thinner than any standard scale wire, and can run a current through it at faster speeds with less resistance, thereby drastically reducing friction and any heat generated by it. Nanowire is typically synthesized from metals or semiconducting materials, such as (but not limited to) copper, silver, zinc oxide, gold, platinum, titanium oxide, etc., or a combination thereof, including even carbon nanotubes, to achieve the desired structure.

Due to the nature of nanowire, ordinary wire coverings will not suffice, and thus a unique carrier for the nanowires 20 is required. This unique carrier would conceivably have to have enough stability and rigidity to properly hold and protect the nanowires 20 carried therein, as well as to be impact-resistant and heat-resistant. Although rigid, the carrier should be flexible enough to take into account the natural movement and shifting generally found inside aircraft and spacecraft during normal operation.

Figure 4:
FIG. 4 is a cross-sectional of the nanowire of FIG. 2 taken along the line 4-4.
Figure 5:
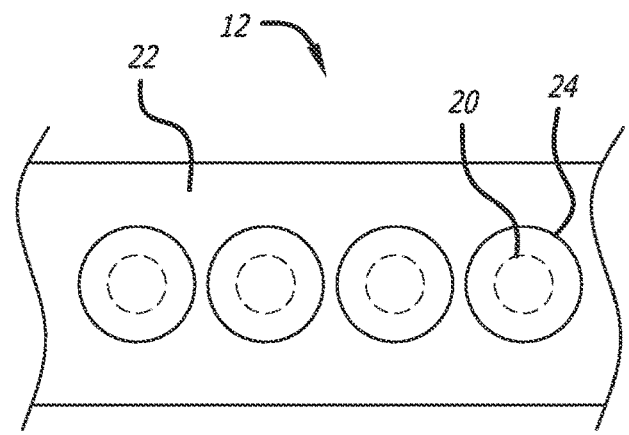
FIG. 5 is front view of a connector of the nanowire electrical conduit of FIG. 2.

To the end, each nanowire conduit 12 further comprises a carrier 22 composed of a material having a modulus of elasticity greater than 1 gigapascal (GPa), and preferably greater than 2 GPa. In the exemplary case, the carrier 22 may be composed of a strong, durable, light-weight composite material, such as carbon-fiber polymer composite material. As best shown in FIG. 4, the conduit 12 includes a pair of slots 24 extending along opposing edges of the carrier 22. As will be described in further detail below, the slots 24 function as a means for integrating the conduit 12 within the wiring system 10. As best shown in FIG. 5, each nanowire conduit 12 also comprises a pair of female connectors 26 located at opposite ends of the carrier 22. Each of the connectors 26 takes the form of a plurality of electrically conductive receptacles in electrical communication with the plurality of nanowires 20. The receptacles 26 may be connected to the ends of the nanowires 20 in any suitable manner, such as soldering or welding. Each receptacle 26 has a diameter that is greater than the respective nanowire 20 to which it is connected, thereby facilitating connection to the corresponding connector of the junction box 16, as will be described in further detail below.

Figure 6:
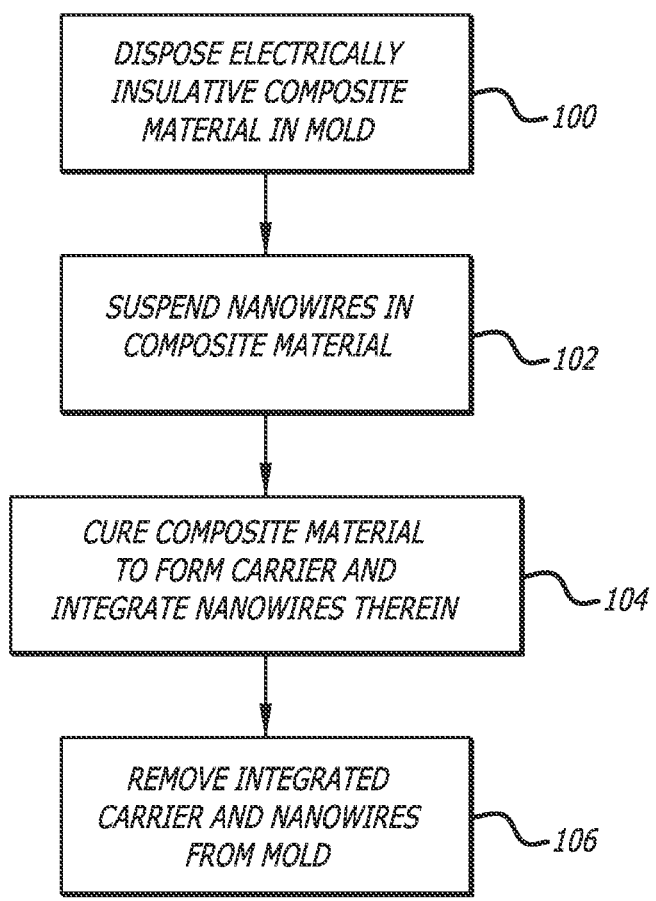
FIG. 6 is a flow diagram illustrating one method of manufacturing the nanowire electrical conduit of FIG. 2.
Figure 7:
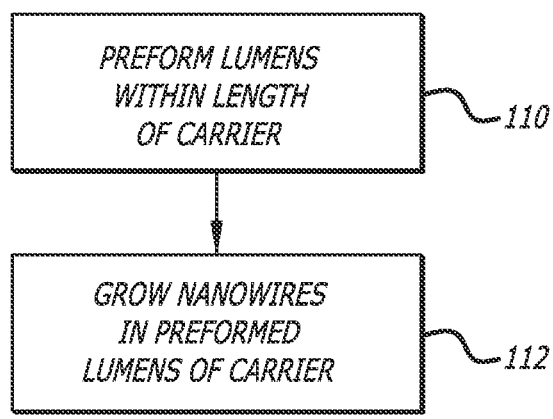
FIG. 7 is a flow diagram illustrating another method of manufacturing the nanowire electrical conduit of FIG. 2.
Figure 8:
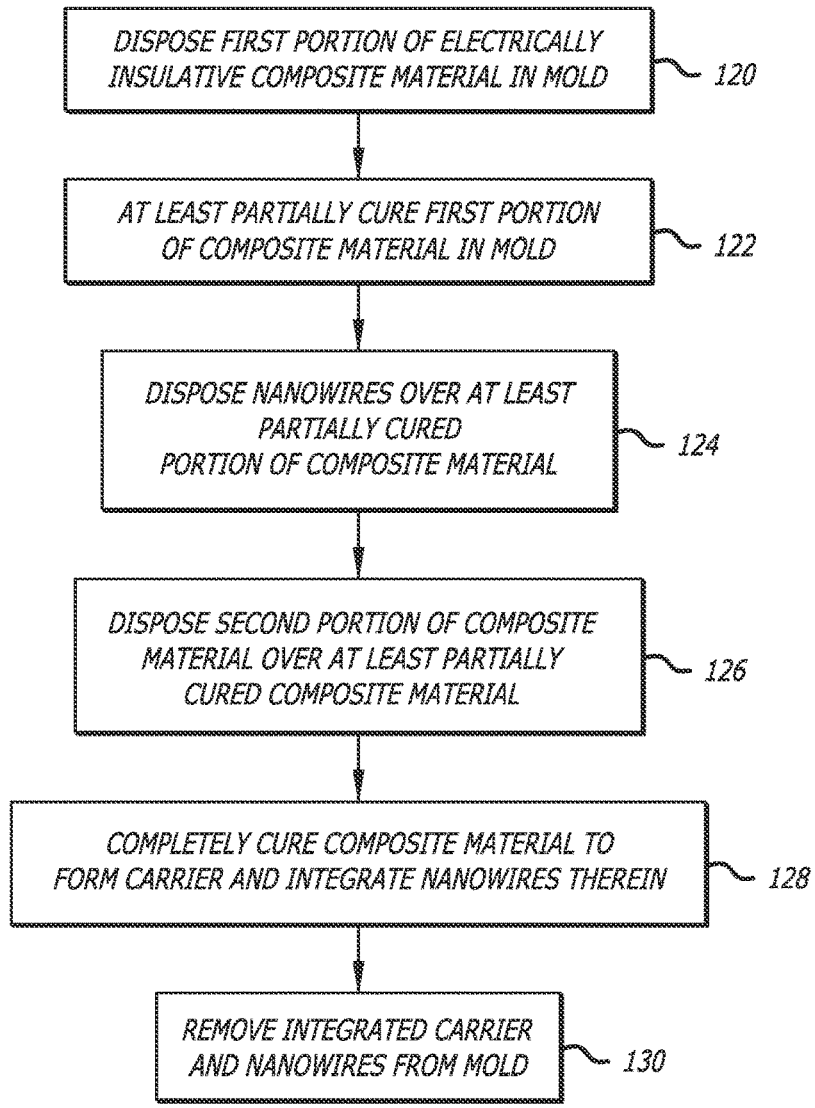
FIG. 8 is a flow diagram illustrating still another method of manufacturing the nanowire electrical conduit of FIG. 2.
Figure 9:
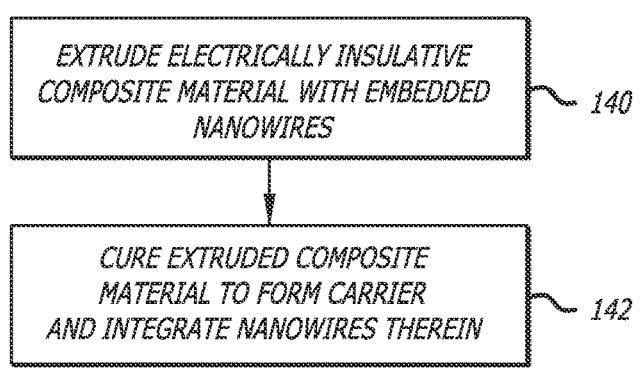
FIG. 9 is a flow diagram illustrating yet another method of manufacturing the nanowire electrical conduit of FIG. 2.

The conduit 12 may be fabricated in any one of a multitude of suitable manners that integrates nanowire with a predetermined length of the conduit at the time of the creation of the conduit. For example, in one process shown in FIG. 6, an electrically insulative composite material may be disposed in an elongated mold (not shown) having a predetermined length equal to the desired length of the conduit 12 (step 100), the nanowires 20 may be suspended in the electrically insulative composite material along the length of the mold (step 102), the electrically insulative composite material can be suitably cured to form the carrier 22 and integrate the nanowires 20 therein (step 104), and the integrated carrier 22 and nanowires 20 can be removed from the mold (step 106). In another process shown in FIG. 7, lumens may be preformed through a length of carrier 22 (either formed during the fabrication of the carrier 22 or formed therein after the fabrication of the carrier 22) (step 110), and the nanowires 20 may be suitably grown within the preformed lumens (step 112). In still another process shown in FIG. 8, a first portion of a liquefied electrically insulative composite material may be disposed in the elongated mold (step 120), the first portion of the liquefied electrically insulative composite material may be at least partially cured (step 122), the nanowires 20 may be disposed on top of the at least partially cured portion of the electrically insulative composite material (step 124), a second portion of the liquefied electrically insulative composite solution may be disposed in the elongated mold over the at least partially cured electrically insulative composite material (step 126), the first and second portions of the electrically insulative composite material are completely cured to form the carrier 22 and integrate the nanowires 20 therein (step 128), and the integrated carrier 22 and nanowires 20 can be removed from the mold (step 130). In yet another process shown in FIG. 9, an electrically insulative composite material may be extruded with the nanowires 20 being embedded in the composite material during the extrusion (step 140), and the electrically insulative composite material is then cured to form the carrier 22 and integrate the nanowires 20 therein (step 142).

In the embodiment illustrated in FIGS. 2-5, the carrier 22 is flat (i.e., planar in nature), and the wires are arranged relative to each other in a single rectilinear plane, thereby minimizing the profile of the conduit 12. In the illustrated embodiment, the cross-section of each nanowire conduit 12 is solid, thereby fully integrating the nanowires 20 in the carrier 22 to maximize the structure integrity and strength of the conduit 12. This design minimizes space usage and to be easily installed in thinner locations.

Figure 10:
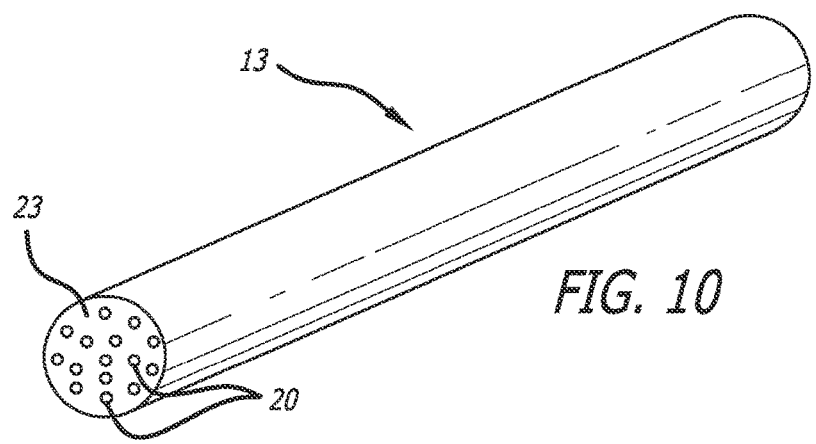
FIG. 10 is a perspective view of one embodiment of a cylindrical nanowire electrical conduit that can be used in the electrical wiring system of FIG. 1.

In an alternative embodiment illustrated in FIG. 10, a conduit 13 comprises a cylindrical carrier 23, with the nanowires 20 arranged in three-dimensional space (i.e., the nanowires 20 are distributed in three dimensions) similar to a traditional electrical conduit. However, in the same fashion that the cross-section of the flat nanowire conduit 12 is solid, the cross-section of the cylindrical nanowire conduit 13 is solid. That is, though it is cylindrical in shape, it can by no means be considered "tubular," as it is one solid cylinder, and therefore no openings. This design emulates the same shape and near the same (but smaller) diameter of a traditional bundle of copper electrical wire, and provides the nanowire conduit 13 the ability to bend around corners or to bend with the curve of a fuselage or any other curved surface, but still remain rigid. This is not to say that the nanowire conduit 13 would be flexible enough to bend at the site during installation, but that it would be fabricated with bends already in place to the predetermined specifications required, and thereby allowing the installation around corners or along arches in one full, long length, without the need for multiple smaller lengths to be used.

The flat nanowire conduits 12 can be exclusively used in the electrical wiring system 10, or cylindrical nanowire conduits 13 can be exclusively used in the electrical wiring system 10, or the flat nanowire conduits 12 and cylindrical nanowire conduits 13 can be used in conjunction with each other in the electrical wiring system 10, where one design may better fit one area of the aircraft or spacecraft and the other design may better fit another area of the aircraft or spacecraft.

Figure 11:
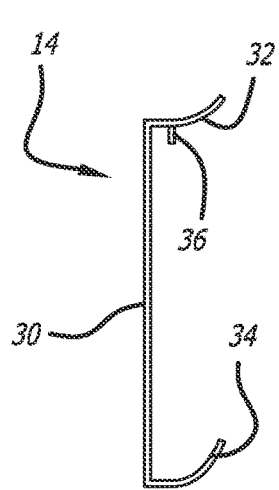
FIG. 11 is a profile view of one embodiment of a bracket used to mount the nanowire electrical conduit of FIG. 2 within the electrical wiring system of FIG. 1.
Figure 12:
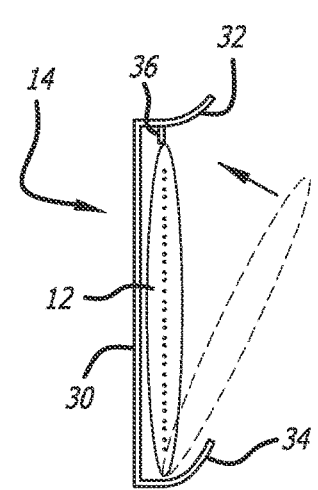
FIG. 12 is a profile view of the bracket of FIG. 11 in which the nanowire electrical conduit of FIG. 2 is mounted.
Figure 13:
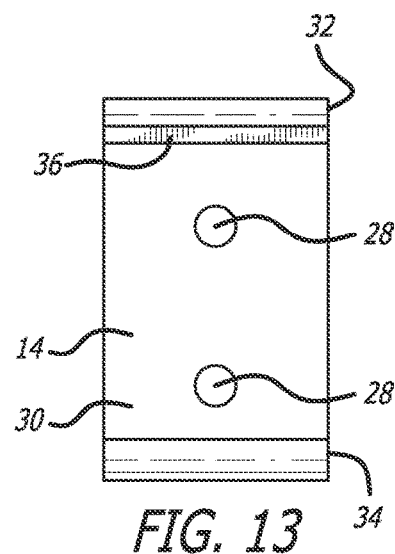
FIG. 13 is a top view of the bracket of FIG. 11.

Referring to FIGS. 11-13, one embodiment of the mounting bracket 14 will now be described. Like the conduits 12, each mounting bracket 14 is specifically designed of a light-weight material, such as a composite material, or even a metallic material if suitable, since the mounting bracket 14 need not have electrically insulative properties. Each of the mounting brackets 14 is capable of being securely affixed to the structure of the aircraft or spacecraft 1 (shown in FIG. 1). In the illustrated embodiment, the mounting brackets 14 have two screw holes 28 (shown in FIG. 13) through which screws (not shown) can be inserted for affixing the mounting bracket 14 at an appropriate location along the structure. Each mounting bracket 14 and conduit 12 is configured for engaging each other in a snap-fit arrangement. In the illustrated embodiment, the mounting bracket 14 includes a base 30, and two flanges 32, 34 extending from the base 30 that are curved in the same direction. The mounting bracket 14 further includes a rail 36 disposed on the inner side of one of the flanges 32, 34 (in this case, the flange 32) that can engage the corresponding slot 24 formed along the edge of the conduit 12.

The mounting bracket 14 has a width that corresponds with the width of the conduit 12, such that the conduit 12 can be firmly engaged with the bracket 14. As shown in FIG. 12, the conduit 12 may be snapped into the bracket 14 by inserting one edge of the conduit 12 into the bracket 14, such that the edge rests on the flange 34, and then the remainder of the conduit 12 can be rotated into the bracket 12 until the rail 38 snaps into the slot 24. The resiliency of the flanges 34 allows the rail 38 to engage the slot 24 under tension.

Figure 14:
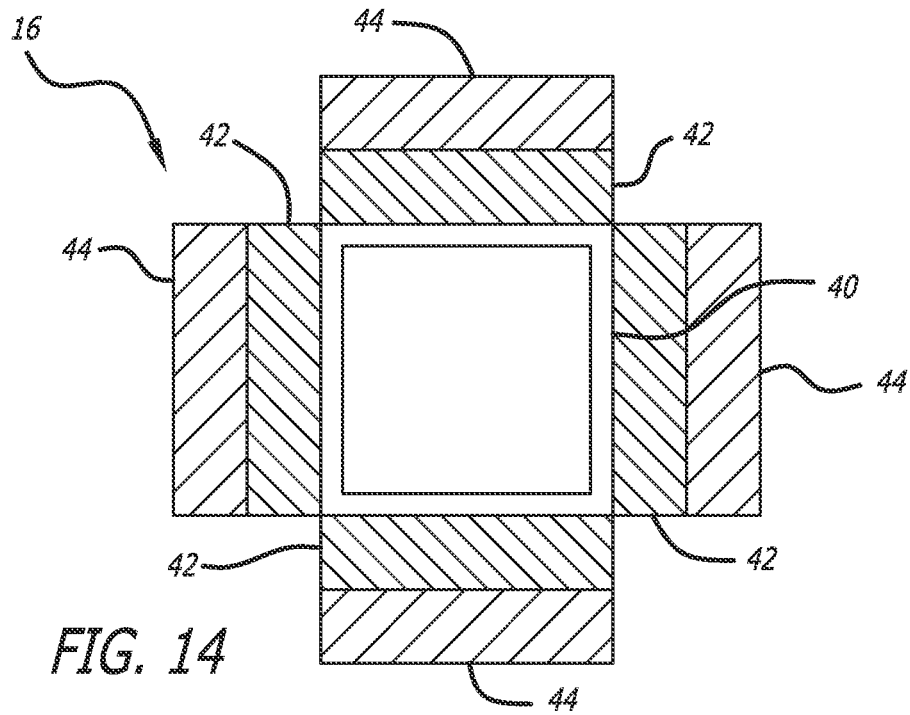
FIG. 14 is a top view of one embodiment of a junction box that can be used in the electrical wiring system of FIG. 1, wherein connectors of the junction box are particularly shown in an open state.
Figure 15:
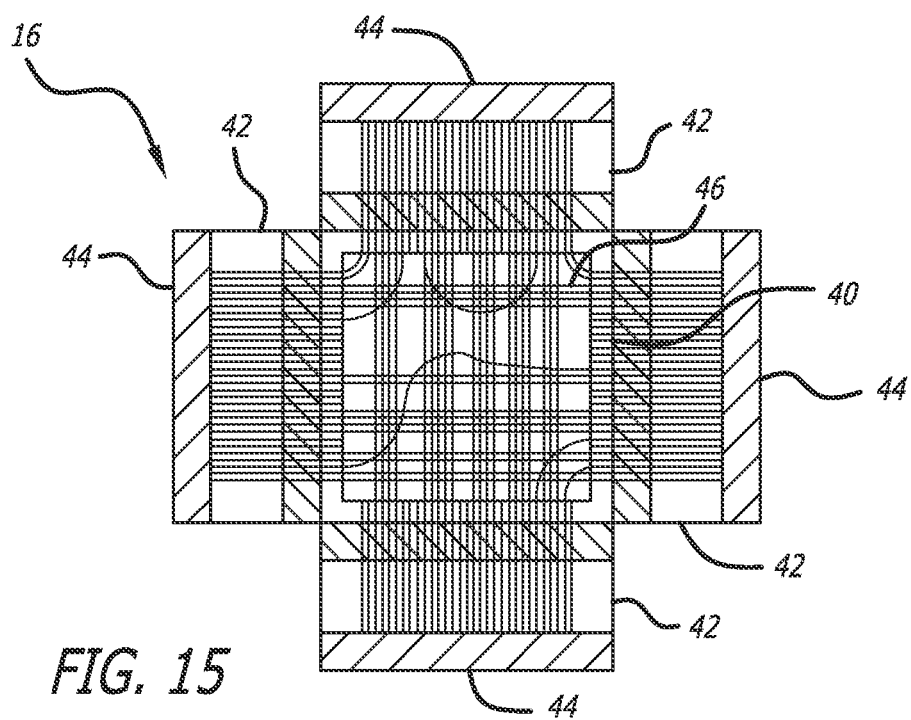
FIG. 15 is a top view of one embodiment of the junction box of FIG. 14, wherein connectors of the junction box are particularly shown in a closed state.
Figure 16:
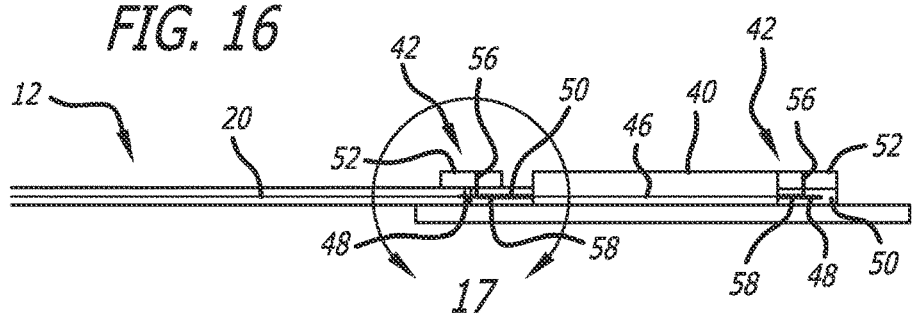
FIG. 16 is a profile view of the junction box of FIG. 14.
Figure 17:
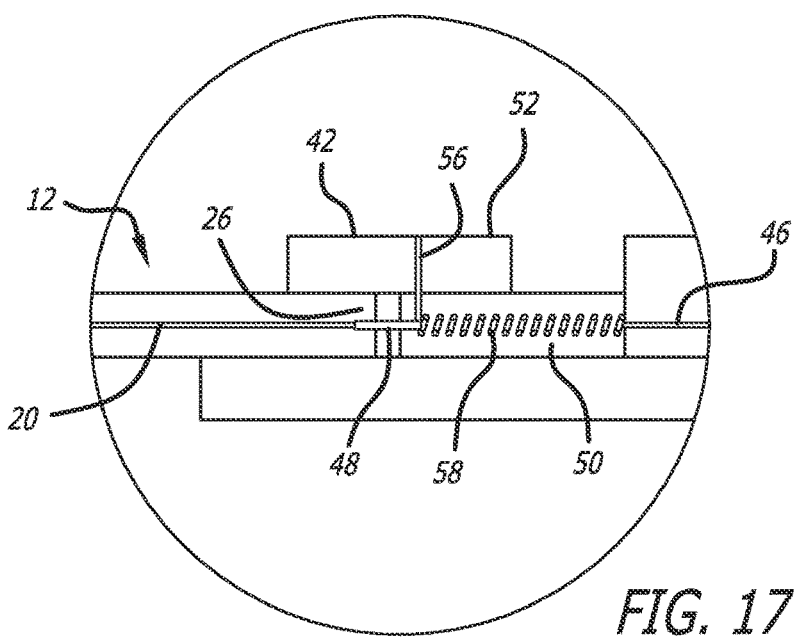
FIG. 17 is a zoom view of the junction box of FIG. 14, taken along the line 17-17.

Referring to FIGS. 14-16, one embodiment of the junction box 16 will now be described. The junction box 16 generally comprises a central wiring module 40, a plurality of male connectors 42 mechanically coupled to the periphery of the central wiring module 40, and a plurality of seats 44 extending from the periphery of the central wiring module 40 underneath the respective plurality of male connectors 42 and on top of which the female connectors 26 of the respective nanowire conduits 12 may be disposed.

As best shown in FIG. 15, the central wiring module 40 includes a plurality of interconnecting wires 46 (which may be nanowires) that couple the male connectors 42 (and thus, the nanowires 20 in the conduits 12 together) in a predefined manner. In the illustrated embodiment, the central wiring module 40 is rectangular, and in this case square, although the central wiring module 40 may have other rectangular shapes or non-rectangular shapes (e.g., polygonal with less than or more than four sides). The central wiring module 40 may be removable, and therefore, interchangeable with other central wiring modules 40 having the same wiring pattern or even different patterns. In this manner, a quick and easy swap-out of a predesigned pathway could be inserted into the junction box 16 as a separate module, or the entire junction box 16, itself, would be considered the module, to allow for changes to any existing pathways. This could be done when installing the conduit 12 for the first time, or for upgrades, changes, or repairs that are made, or any new electrical equipment that is added.

The connections from the junction box 16 to the conduits 12 are designed to allow the conduits 12 to lay flat against the structure of the aircraft or spacecraft 1 (shown in FIG. 1), and would not require any additional space to make a connection. The connection points from the junction box 12 to the conduits 12 would touch flush against each other while the end of the conduit strips 12 would rest on the respective junction seats 44, thereby effectively allowing repairs or replacements to be made within the currently used space; without having to adjust for any additional space to connect or disconnect the conduits 12 to or from the junction box 16. The male connectors 42 on the junction box 16 provide the aforementioned capability, allowing for easy swap-outs of the conduits 12, as all conduits 12 would be identical and interchangeable (based on the design for that specific application). The male connectors 42 of the junction box 16 would make removal of any conduits 12 simple, quick, and easy, aiding in faster repairs and replacement of conduits 12 as necessary.

Thus, it should be appreciated that the male and female plunger-style connection made between the conduits 12 and the junction boxes 16 is what gives the connections between the conduits 12 to the junction boxes 16 the ability to remain flush to each other without having the need for space to pull them apart as would be needed for traditional wire connections. Instead, they would be "coupled" and "de-coupled" rather than being "pushed together" or "pulled apart."

To this end, each of the male connectors 42 includes a plurality of pins (or plungers) 48, a housing 50 containing the pins 48, and an actuator 52 mounted to the housing 50 and configured for linearly translating the plurality of pins 48 away from the periphery of the central wiring module 40 and into the plurality of receptacles of each female connector 26 of the respective conduit 12. The pins 48 respectively correspond to the receptacles 26 (or nanowires), and therefore, are arranged relative to each other in a single rectangular plane.

The actuator 52 is configured for being linearly translated relative to the housing 50 to linearly translate the pins 48 into the receptacles 26. In the illustrated embodiment, the housing 50 and actuator 52 take the form of blocks that slide relative to each other, and in particular, the actuator 52 slides over the housing 50 from an open position (right side of FIG. 16) to linearly translate the pins 48 into the receptacles 26 to a closed position (left side of FIG. 16). To this end, the housing 50 comprises a plurality of slots (not shown), and the junction box 16 comprises a plurality of vertical levers 56 extending from the actuator 52 into the slots (not shown) and mechanically coupling to the pins 48.

Because it is the pins 48 of the male connector 42 that linearly translate, while the receptacles 26 of the conduit 12 remain fixed, it is important that there be some slack between the pins 48 and the interconnecting wires 46 of the central wiring module 40 when the male connector 42 is in the open position, so that when the male connector 42 is closed (i.e., the pins 48 are displaced towards the receptacles 26), the interconnecting wires 46 to which the pins 48 are coupled are not stressed. To this end, the junction box 16 comprises a plurality of electrically conductive coils 58 (and in this case, nanocoils) that are contained within bores (not shown) in the housing 50. The conductive coils 58 are electrically coupled between the pins 48 and the interconnecting wires 46, thereby providing the desired slack between the pins 48 and the interconnecting wires 46 in order to provide linear freedom of movement of the pins 48. The coils 58 may be formed at the end section of a nanowire would be both coiled around and integrated into the pins 48. The pins 48 should have ability to pull the coils 58 the full length of the connection without breaking them (which it shouldn't, due to the superior tensile strength and durability of Nanowire), and they should be reusable, without damaging the connections or wearing them down to a point that causes the connections to fail.

Figure 18:
FIG. 18 is a profile view of a connector of the junction box of FIG. 14.
Figure 19:
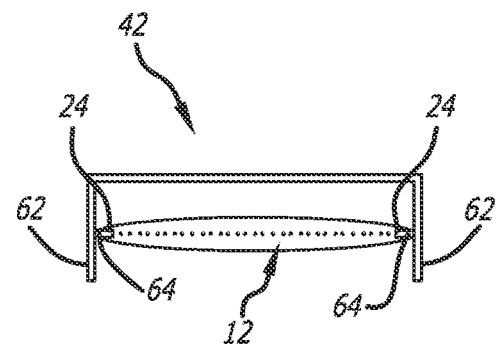
FIG. 19 is a profile view of the connector of FIG. 18 mated with a connector of the nanowire electrical conduit of FIG. 2.

Referring now to FIGS. 18 and 19, the male connector 42 is configured for being affixed to the respective conduit 12 when in the closed position. In particular, the male connector 42 comprises a pair of flanges 62 that extends downward past the opposing edges of the conduit 12. The male connector further comprises a pair of rails 64 disposed on the inner surfaces of the flanges 62 that correspond with the pair of slots 24 of the conduit 12. In this manner, as the male connector 42 is displaced from its open position to its closed position, the rails 64 slidably engage the respective slots 24 of the conduit 12, thereby affixing the conduit 12 to the junction box 16 via the male connector 42.

Figure 20:
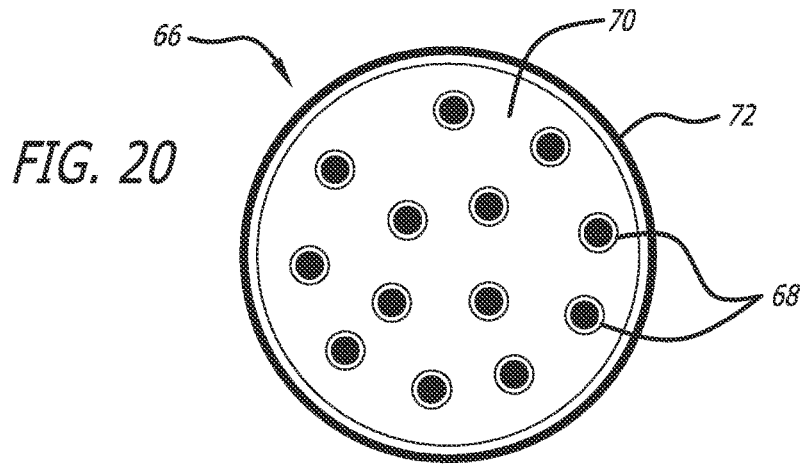
FIG. 20 is an end view of an optional embodiment of a connector of the junction box of FIG. 14 that can be used with the cylindrical nanowire electrical conduit of FIG. 10.

Referring to FIG. 20, an alternative embodiment of a male connector 66 that can be used in place of any one or more of the male connectors 42 of the junction box 16 will now be described. The male connector 66 is designed to couple with the cylindrical nanowire conduit 13 illustrated in FIG. 10. In particular, like the male connector 42, the male connector 66 includes a plurality of pins (or plungers) 68, a housing 70 containing the pins 68, and an actuator 72 mounted to the housing 70 and configured for linearly translating the plurality of pins 68 away from the periphery of the central wiring module 40 (not shown in FIG. 20) and into the plurality of receptacles of each female connector (not shown) of the respective conduit 13. Unlike the male connector 42, the housing 70 and actuator 72 of the male connector 66 are not block-shaped, but rather cylindrically shaped. In addition, the actuator 72 is configured for being rotationally translated (shown by arrow) relative to the housing 70, e.g., via a threaded arrangement between the actuator 72 and the housing 70, to linearly translate the pins 68 away from the periphery of the central wiring module 40.

Figure 21:
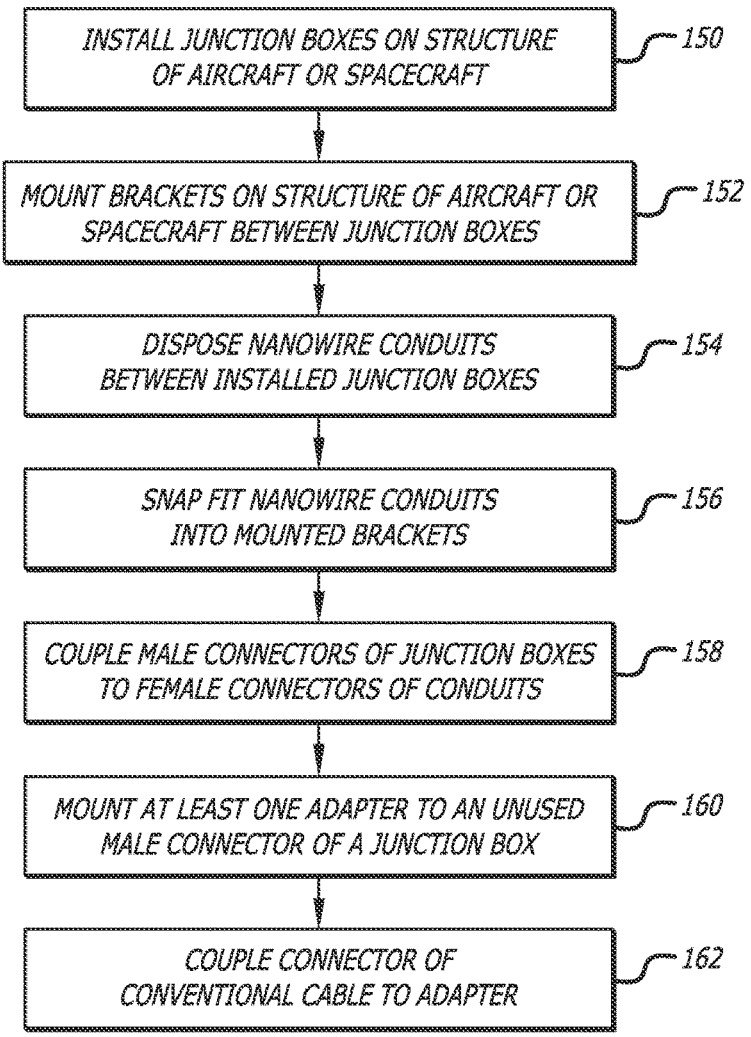
FIG. 21 is a flow diagram of one method of installing the electrical wiring system of FIG. 1 onto the structure of an aircraft or spacecraft.

Referring now to FIG. 21, one method of installing the electrical wiring system 10 on the structure of an aircraft or spacecraft 1 will now be described. First, the junction boxes 16 are spaced apart and installed on the structure 1 in a prearranged manner (step 150). Next, brackets 14 are mounted to the structure of the aircraft or spacecraft 1 between the junction boxes 16 (step 152). One or several brackets 14 may be mounted between each adjacent pair of junction boxes 16. Next, the nanowire conduits 12 are disposed between the male connectors 42 of the junction boxes 16 (one conduit 12 between each adjacent pair of junction boxes 16), such that the connectors 26 of the conduit 12 are flush with the respective connectors 42 of the junction boxes 16 when they are disposed therebetween (step 154), and then conduits 12 are snap fitted within the mounted brackets 14 (step 156). Next, the respective male connectors 42 of the junction boxes 16 are coupled to the female connectors (or receptacles) 26 of the conduit 12 (step 158). The method optionally comprises mounting an adapter (not shown) to an unused male connector 42 of the junction box 16 (step 160), and coupling a connector of a conventional cable (not shown) (i.e., a cable comprising a plurality of individually insulated wires in electrical communication with the connector of the cable) that is incompatible with the male connector 42 of the junction box 16 (step 162). Optionally, the existing electrical wiring system 10 can be conveniently repaired or a portion thereof replaced by removing one of the conduits 12 and replacing it with a new conduit 12 of the same length by repeating steps 152-156 for the new conduit 12 or by swapping out a central wiring module 40 from its respective junction box 16.

It should be appreciated that, although the design of the conduit 12 lends itself well to the use of nanowires, the conduit design can be modified in scale to accommodate any size or type of wire (including standard copper electrical wire) for any purpose, including normal everyday applications, such as household, commercial, mass transit, and other such uses.

Although particular embodiments have been shown and described, it should be understood that the above discussion is not intended to limit the scope of these embodiments. While embodiments and variations of the many aspects of the present disclosure have been disclosed and described herein, such disclosure is provided for purposes of explanation and illustration only. Thus, various changes and modifications may be made without departing from the scope of the claims.

Where methods described above indicate certain events occurring in certain order, those of ordinary skill in the art having the benefit of this disclosure would recognize that the ordering may be modified and that such modifications are in accordance with the variations of the present disclosure. Additionally, parts of methods may be performed concurrently in a parallel process when possible, as well as performed sequentially. In addition, more parts or less part of the methods may be performed.

Accordingly, embodiments are intended to exemplify alternatives, modifications, and equivalents that may fall within the scope of the claims.

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

Although particular embodiments have been shown and described, it should be understood that the above discussion is not intended to limit the scope of these embodiments. While embodiments and variations of the many aspects of the present disclosure have been disclosed and described herein, such disclosure is provided for purposes of explanation and illustration only. Thus, various changes and modifications may be made without departing from the scope of the claims.

Where methods described above indicate certain events occurring in certain order, those of ordinary skill in the art having the benefit of this disclosure would recognize that the ordering may be modified and that such modifications are in accordance with the variations of the present disclosure. Additionally, parts of methods may be performed concurrently in a parallel process when possible, as well as performed sequentially. In addition, more parts or less part of the methods may be performed.

Accordingly, embodiments are intended to exemplify alternatives, modifications, and equivalents that may fall within the scope of the claims.

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

I claim:

1. An electrical wiring system, comprising:
   an electrical conduit comprising:
      a plurality of electrically conductive wires, wherein the wires are nanowires;
      a carrier encapsulating and electrically insulating the wires from each other, the carrier being composed of a rigid material; and
      a pair of connectors located at opposite ends of the carrier, wherein each of the connectors comprises a plurality of receptacles in electrical communication with the plurality of nanowires; and
   a junction box comprising a plurality of interconnecting wires and a plurality of connectors electrically coupled together by the interconnecting wires, one of the connectors of the junction box being coupled to at least one of the connectors of the electrical conduit,
   wherein each of the connectors of the junction box comprises a plurality of pins and an actuator to translate the pins into the receptacles of at least one of the connectors of the electrical conduit.

2. The electrical wiring system of claim 1, wherein the rigid material has a modulus of elasticity greater than 1 gigapascal (GPa).

3. The electrical wiring system of claim 2, wherein the modulus of elasticity of the material is greater than 2 GPa.

4. The electrical wiring system of claim 1, wherein the rigid material is a composite material.

5. The electrical wiring system of claim 1, wherein the carrier is planar, and the wires are arranged relative to each other in a single rectilinear plane.

6. The electrical wiring system of claim 1, wherein the carrier is cylindrical, and the wires are arranged relative to each other in three-dimensional space.

7. The electrical wiring system of claim 1, wherein the electrical conduit is entirely solid.

8. The electrical wiring system of claim 1, wherein the connectors are mounted to the ends of the carrier and are electrically coupled to the wires.

9. The electrical wiring system of claim claim 1, wherein the nanowires are synthesized from at least one of a metal, a semiconductor, or carbon nanotubes.

10. The electrical wiring system of claim 1, further comprising a pair of slots extending along opposing sides of the carrier at the end of the carrier.

11. The electrical wiring system of claim 1, further comprising a slot formed along a length of the carrier.

12. A method of manufacturing the electrical conduit of claim 1, comprising:
   disposing an electrically insulative material in an elongated mold having a length;

suspending the wires in the electrically insulative material along the length of the mold;

curing the electrically insulative material in the mold to form the carrier and integrate the wires in the mold; and removing the integrated carrier and wires from the elongated mold.

13. A method of manufacturing the electrical conduit of claim 1, comprising:

forming lumens through a length of the carrier; and growing the wires inside of the lumens.

14. The electrical wiring system of claim 1, wherein the material is a carbon-fiber polymer composite material.

15. The electrical wiring system of claim 1, wherein the interconnecting wires of the junction box are nanowires.

16. The electrical wiring system of claim 1, wherein the electrical conduit is planar, and the wires are arranged relative to each other in a single rectilinear plane.

17. A method of manufacturing the electrical conduit of claim 1, comprising:

disposing a first portion of a liquefied electrically insulative material in an elongated mold having a length;

at least partially curing the first portion of the liquefied electrically insulative material in the elongated mold;

disposing the wires on top of the at least partially cured portion of the electrically insulative material along the length of the mold;

disposing a second portion of the liquefied electrically insulative material over the at least partially cured portion of the electrically insulative material in the elongated mold;

completely curing the electrically insulative material in the mold to form the carrier and integrate the wires between the first and second portions of the completely cured electrically insulative material; and removing the integrated carrier and wires from the elongated mold.

18. A method of manufacturing the electrical conduit of claim 1, comprising:

extruding an liquid insulative material, wherein the wires are embedded in the liquid insulative material during the extrusion; and curing the liquid insulative material to form the carrier.

19. The electrical wiring system of claim 1, wherein the electrical conduit is cylindrical, and the wires are arranged relative to each other in three-dimensional space.

20. The electrical wiring system of claim 1, wherein the electrical conduit has a thickness of less than one-quarter inch.

* * * * *